United States Patent
De Filippis (10) Patent No.: US 9,148,044 B2
(45) Date of Patent: Sep. 29, 2015

(54) ROTATING ELECTRIC MACHINE AND RELATED PACKAGING METHOD

(75) Inventor: Pietro De Filippis, Varazze (IT)

(73) Assignee: SPAL AUTOMOTIVE S.R.L. (IT)

( * ) Notice: Subject to any disclaimer, the term of this patent is extended or adjusted under 35 U.S.C. 154(b) by 99 days.

(21) Appl. No.: 14/131,574

(22) PCT Filed: Jul. 10, 2012

(86) PCT No.: PCT/IB2012/053527
§ 371 (c)(1),
(2), (4) Date: Jan. 8, 2014

(87) PCT Pub. No.: WO2013/008180
PCT Pub. Date: Jan. 17, 2013

(65) Prior Publication Data
US 2014/0139059 A1 May 22, 2014

(30) Foreign Application Priority Data
Jul. 11, 2011 (IT) .................... BO11A0413

(51) Int. Cl.
*H05K 5/06* (2006.01)
*H02K 11/00* (2006.01)
(Continued)

(52) U.S. Cl.
CPC .............. *H02K 11/0073* (2013.01); *F04D 25/08* (2013.01); *F04D 25/082* (2013.01); *F04D 29/5813* (2013.01); *H02K 9/22* (2013.01); *H05K 1/0263* (2013.01); *H02K 3/522* (2013.01); *H02K 5/10* (2013.01); *H02K 5/18* (2013.01); *H02K15/12* (2013.01); *H02K 2205/09* (2013.01); *H05K 1/0201* (2013.01); *H05K 2201/10272* (2013.01)

(58) Field of Classification Search
CPC ......... H05K 3/284; H05K 1/185; H02K 9/24; H02K 3/24; H02K 3/26
USPC ............ 323/265, 276, 282; 360/99.16, 99.23, 360/99.21; 310/64, 68 C; 174/521, 526
See application file for complete search history.

(56) References Cited

U.S. PATENT DOCUMENTS 6,340,791 B1 * 1/2002 Stotz .............................. 174/521
6,429,999 B1 * 8/2002 Dague et al. ................ 360/99.16
(Continued)

FOREIGN PATENT DOCUMENTS

EP 2215705 8/2010
JP 2004134491 4/2004
(Continued)

OTHER PUBLICATIONS

International Search Report dated Sep. 13, 2013 for counterpart Internatonal Application No. PCT/IB2012/053527.

*Primary Examiner* — Rita Leykin
(74) *Attorney, Agent, or Firm* — Timothy J. Klima; Shuttleworth & Ingersoll, PLC (57) ABSTRACT

Described is a rotating electrical machine integrating an electronic module comprising a printed circuit, a plurality of electronic power and signal components positioned on the components side of the printed circuit, a plurality of conductor tracks, positioned on the welding side opposite the components side of the printed circuit, which implement the direct electrical connections between the electronic power components; the electronic power and signal components are in contact through a filler with the cap of the electrical machine for allowing an optimum dispersal of the heat generated by them, the contact being guaranteed by elastic elements which press on a support in which the electronic module is housed.

6 Claims, 8 Drawing Sheets

(51) Int. Cl.
  *F04D 25/08* (2006.01)
  *F04D 29/58* (2006.01)
  *H02K 9/22* (2006.01)
  *H02K 5/10* (2006.01)
  *H02K 3/52* (2006.01)
  *H02K 5/18* (2006.01)
  *H02K 15/12* (2006.01)
  *H05K 1/02* (2006.01)

(56) References Cited

U.S. PATENT DOCUMENTS

| | | | |
|---|---|---|---|
| 6,519,110 B2 * | 2/2003 | Dague et al. | 360/99.17 |
| 6,545,845 B2 * | 4/2003 | Dague et al. | 360/265.6 |
| 6,594,117 B2 * | 7/2003 | Dague et al. | 360/256.2 |
| 6,680,113 B1 * | 1/2004 | Lucast et al. | 428/354 |
| 7,224,145 B2 * | 5/2007 | Pierret et al. | 322/25 |
| 7,800,264 B2 * | 9/2010 | Dubuc et al. | 310/68 R |
| 7,859,147 B2 * | 12/2010 | Dubuc et al. | 310/68 D |
| 7,872,383 B2 * | 1/2011 | Dubuc et al. | 310/68 R |
| 7,932,649 B2 * | 4/2011 | Dubuc et al. | 310/71 |
| 8,531,067 B2 * | 9/2013 | Tunzini et al. | 310/68 D |
| 2011/0127912 A1 | 6/2011 | Lee et al. | |

FOREIGN PATENT DOCUMENTS

| | | |
|---|---|---|
| JP | 1119732 | 6/2011 |
| WO | 2009/066248 | 5/2009 |
| WO | 201013696 | 12/2010 |

* cited by examiner

ROTATING ELECTRIC MACHINE AND RELATED PACKAGING METHOD

This application is the National Phase of International Application PCT/IB2012/053527 filed Jul. 10, 2012 which designated the U.S. and that International Application was published under PCT Article 21(2) in English.

This application claims priority to Italian Patent Application No. B02011A000413filed Jul. 11, 2011, the entirety of which is incorporated by reference herein.

TECHNICAL FIELD

This invention relates to a rotating electrical machine and its assembly or packaging with reference in particular to the integrated electronic control module.

BACKGROUND ART

In general, a rotating electrical machine comprises a casing having inside a stator, rigidly connected to the casing, and a rotor, for example with permanent magnets, rotatably connected to it.

An electronic module or electronic control module, connected to the stator, comprises a plurality of active and passive electronic components forming a power section, and a plurality of electronic signal components, forming a control section.

The electrical machines referred to in this description are of the closed type, in particular the so-called "sealed" type, that is, sealed electrical machines, and having the relative electronic control module inside. The casing and a cap form a closed container from which protrude connection terminals provided for the power supply of the control electronics.

A prior art rotating electrical machine equipped inside with an electronic control module is described in application WO2009/066248 the name of the same Applicant.

In that solution, the electronic module comprises a plurality of copper conductor tracks on which the electronic power components are mounted and a printed circuit on which only signal components are mounted, welded to the conductor tracks.

The conductor tracks are "embedded" in a supporting element made of plastic material by overmolding.

The electronic module is cooled by placing in contact the conductor tracks with a dissipating element formed by the cap of the motor, using "pads" with high thermal conductivity.

A limit of reliability of the solution is due to the possibility of occurrence, in the presence of more or less sudden temperature variations, of breakages of the welds between the printed circuit and the conductor tracks on account of the difference between the thermal expansion coefficients of the printed circuit and of the plastic material in which the above-mentioned conductor tracks are "embedded".

Figure 1:
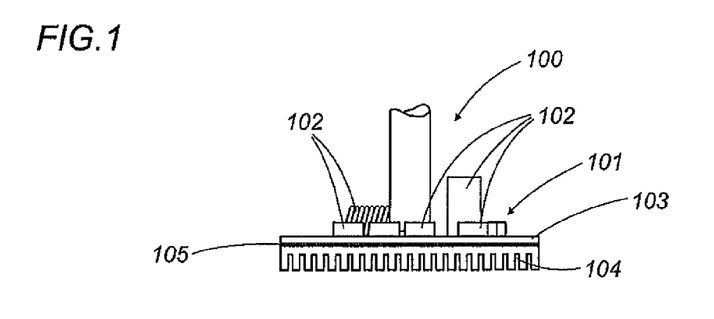
FIG. 1 shows an example of an electronic circuit according to the current state of the art in which this invention is applied.

Another prior art solution is schematically shown in FIG. 1 and relates to a rotating electrical machine 100 comprising an electronic circuit 101 having all the power components 102 positioned on the same side of the printed circuit 103. Some tracks of the printed circuit 103 implement the direct connections between the power components 102. In this case, the heat generated by the power components 102 is dissipated by placing in contact with a dissipator 104 the side of the printed circuit opposite the one on which the power components 102 are located, by interposing an electrical insulating layer 105.

This solution also presents a limit in terms of reliability since the heat generated by the power components 102 flowing through the printed circuit 103 may adversely affect the condition of both the printed circuit and the connections of the power components 102.

DISCLOSURE OF THE INVENTION

In this context, the main technical purpose of this invention is to provide a rotating electrical machine with the integrated electronic module free of the above-mentioned disadvantages.

A first aim of this invention is to make a reliable rotating electrical machine in which the condition of the electronic module is preserved during operation of the machine.

Another aim is to provide a rotating electrical machine which effectively disperses the heat generated inside, in particular the heat produced by the electronic control module.

The technical purpose and aims specified are substantially achieved by an electrical machine comprising the features described in independent claim 1; this invention also relates to a method of packaging a rotating electrical machine having the packaging steps described in independent claim 5.

BRIEF DESCRIPTION OF THE DRAWINGS

Further features and advantages of this invention are more apparent from the non-limiting description which follows of a preferred, non-limiting embodiment of a rotating electrical machine as illustrated in the accompanying drawings, in which.

DESCRIPTION OF THE PREFERRED EMBODIMENTS OF THE INVENTION

Figure 2:
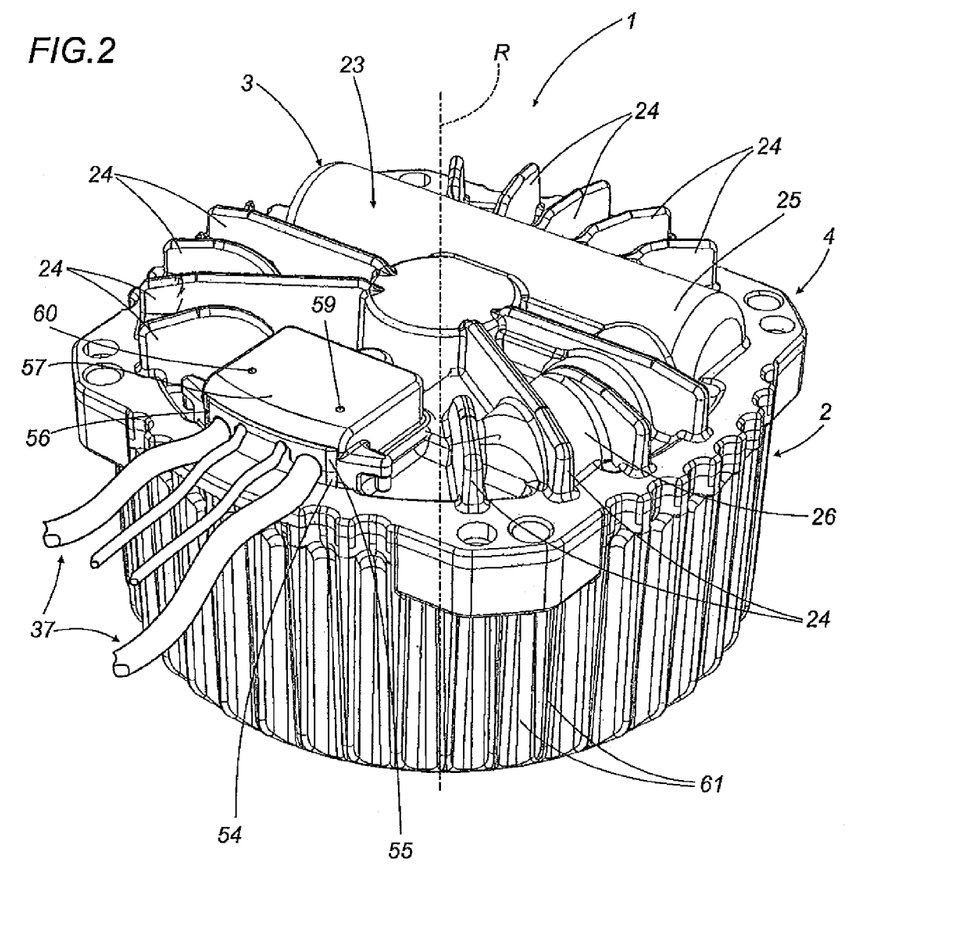
FIG. 2 shows a schematic perspective view of a rotating electrical machine according to this invention.
Figure 3:
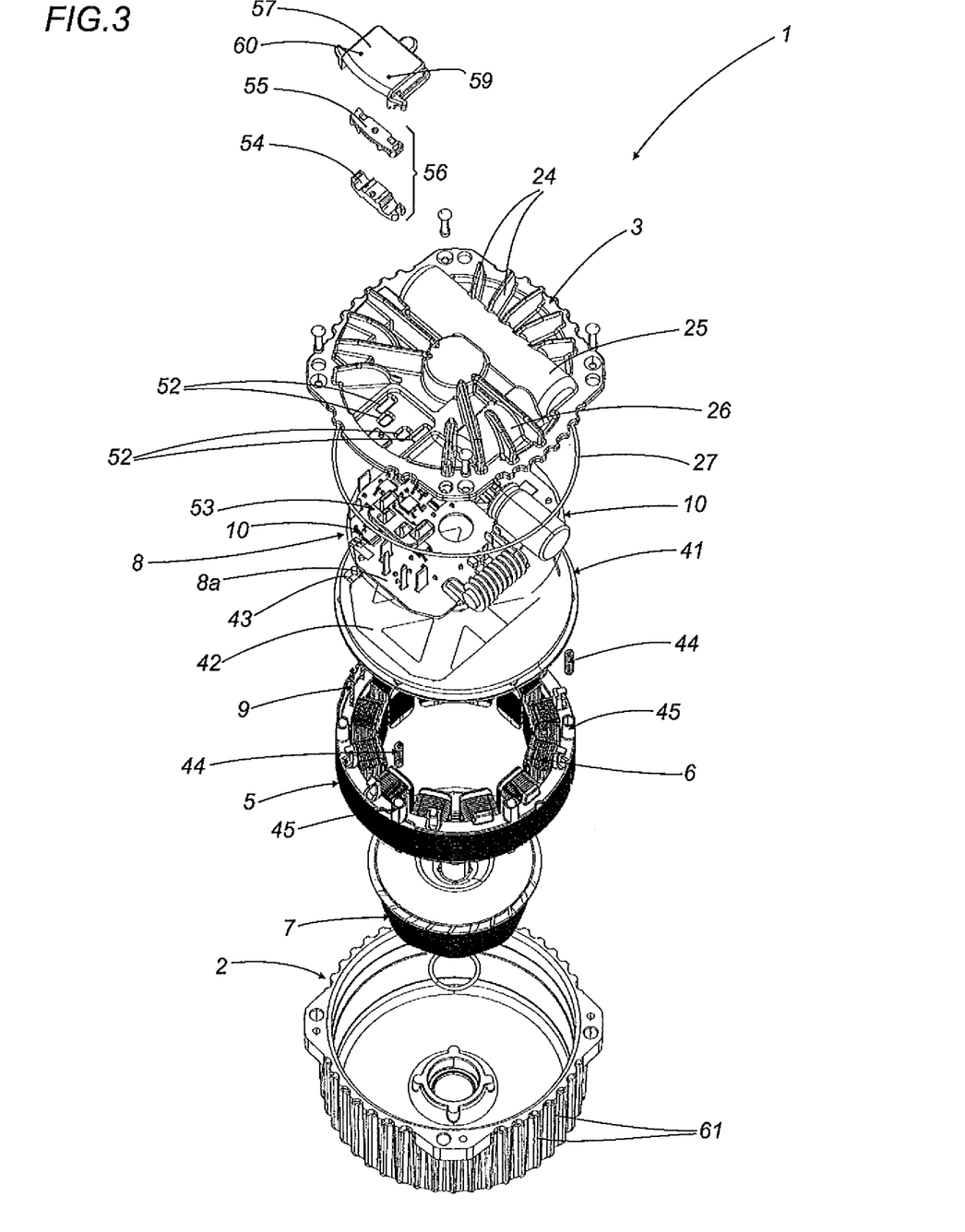
FIG. 3 shows a schematic perspective and exploded view of a rotating electrical machine of FIG. 2 with some parts cut away to better illustrate others.

With reference to FIGS. 2 and 3, the numeral 1 denotes a rotating electrical machine in accordance with this invention.

The machine 1 in the preferred embodiment is an electric motor of the "sealed" type, that is, without any openings for access to the inside, to which express reference will hereinafter be made but without thereby limiting the scope of the invention.

The electrical machine 1 will be described in detail solely for the parts necessary for the understanding of this invention.

The machine 1 comprises a casing 2 and a cap 3 for closing the casing 2 to form, with the casing 2, a case or closed container 4.

The electrical machine 1 also comprises a stator 5 fixed to the casing 2 and comprising an electrical winding 6 having terminals 9, and a rotor 7 inserted in the case 4 and fixed to the case in a rotatable fashion about an axis of rotation R.

The stator 6 is described in the patent EP2215705 which is referred to herein in its entirety for the purposes of a complete description.

As illustrated in FIG. 3, the electrical machine 1 comprises an electronic module 8, inserted at least partly in the casing 2, for supplying the electrical winding 6.

The electrical machine 1 also comprises a dissipator 3 for dissipating the heat generated inside the case 4, in particular by the electronic module 8.

In the embodiment illustrated, the dissipator is preferably formed by the cap 3 for closing the casing 2.

The electronic module 8 comprises a plurality of electronic components 10 such as, for example, the MOSFETs 12a supplying the motor, the capacitors 11a, the filter inductor 11b, the shunt 64, the MOSFET driver 65 and the microcontroller 66.

Amongst the electronic components 10 there are electronic power components 67 and electronic signal components 68.

The electronic power components 67 comprise the MOSFETs 12a supplying the motor 1, the capacitors 11a, the filter inductor 11b and the shunt 64.

The electronic signal components 68 comprise the microcontroller 66 and the MOSFET driver 65.

The MOSFETs 12a, the microcontroller 66, the shunt 64 and the MOSFET driver 65 are "SMD" type electronic components 12, that is, "Surface Mounting Devices".

The components 11, that is, the capacitors 11a and the inductor 11b, are "PTH" type electronic components, that is, Pin Through Hole.

The MOSFETs 12a and the shunt 64 are therefore the "SMD" electronic power components.

The MOSFET driver 65 and the microcontroller 66 constitute the "SMD" electronic signal components.

In an alternative embodiment not illustrated, the inductor 11b is also an "SMD" type electronic component.

Figure 5:
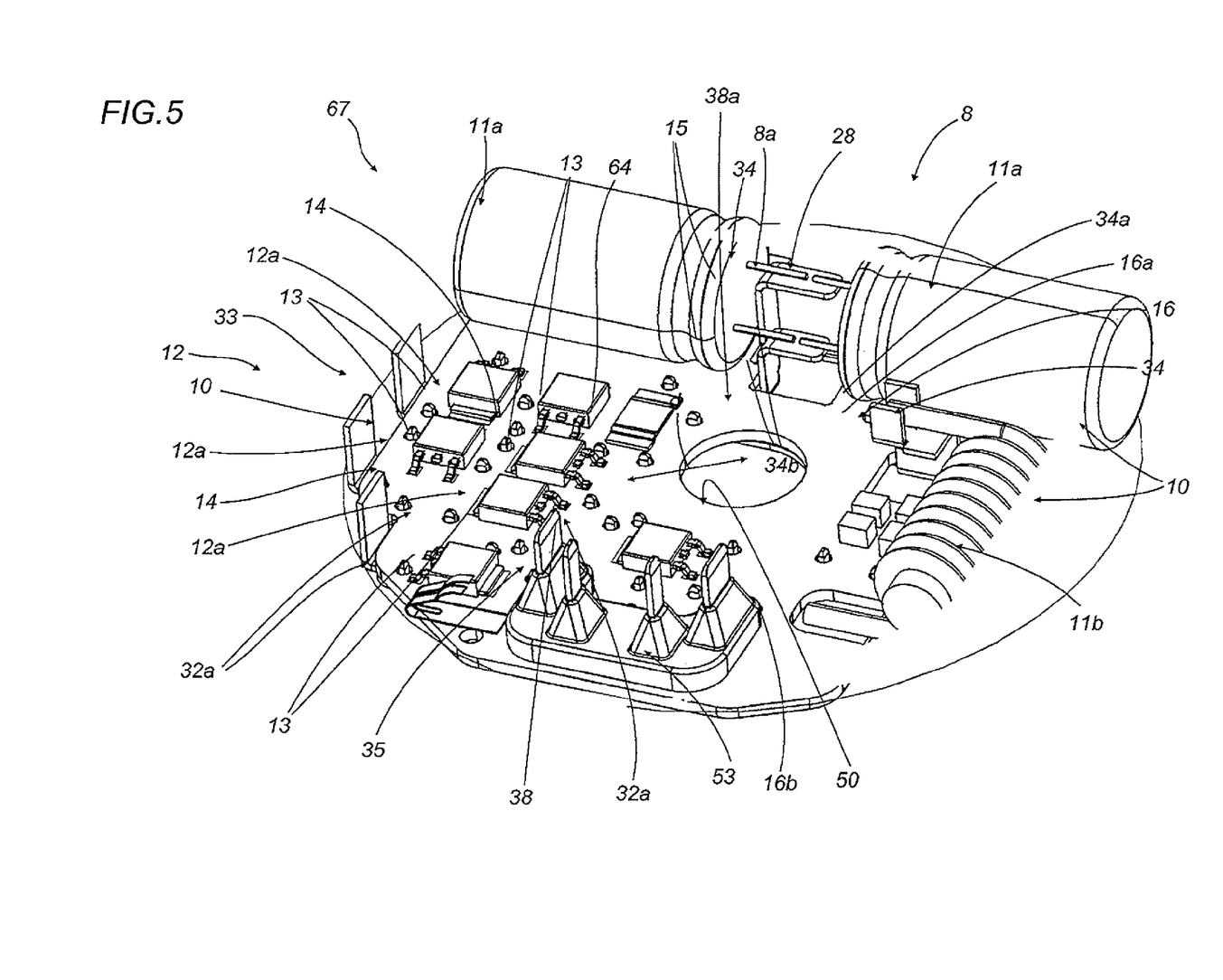
FIG. 5 shows a second schematic perspective view of the electronic control module of FIG. 4 with some parts cut away.

As illustrated in FIG. 5, the MOSFETs 12a are electronic components having a case 13 with a substantially parallelepiped shape and equipped with connection terminals 14.

The capacitor 11a, illustrated as an example, has a substantially cylindrical shape and has relative connection terminals 15.

The inductor 11a, illustrated as an example, has a substantially cylindrical shape with a spiral conformation and has respective connection terminals 16.

As illustrated in FIG. 3, the electronic components 10 are facing the cap 3.

The conventional "SMD" electronic components 12 and "PTH" electronic components 11 are positioned on a first side or components side 8a of the electronic module 8 so as to be facing toward the cap 3.

The heat generated by the "SMD" components 12 and by the "PTH" components 11 of the electronic module 8 is effectively dissipated by the cap 3 since they are all facing towards it.

So as to maximise the heat exchange, a thermally conductive paste 22, for example of the type known as "thermally conductive gap filler", is interposed between the above-mentioned electronic components and the cap 3 which, as mentioned, acts as a dissipator.

Figure 7:
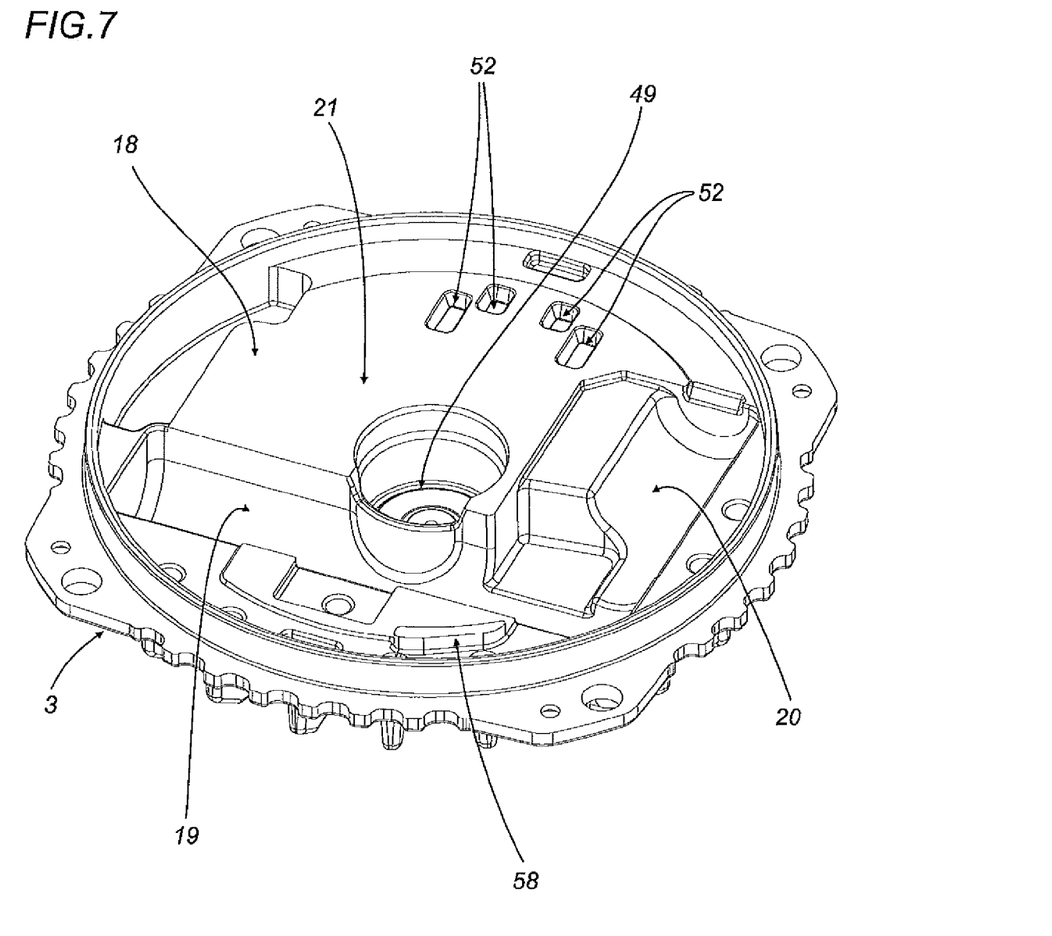
FIG. 7 shows a scaled-up schematic perspective view of the cap of the machine of FIG. 3.

With reference in particular to FIG. 7, the inner surface 18 of the cap 3 has a first portion 19 forming a concave seat shaped so as to couple with clearance with the substantially cylindrical outer surface of the two capacitors 11a.

A second portion 20 forms a second concave seat shaped so as to couple with clearance with the substantially cylindrical outer surface of the inductor 11b.

To optimise the "thermal" contact between the cap 3, which—as mentioned above—acts as a dissipator, and the "SMD" electronic components 12 mounted on the components side 8a of the printed circuit 28, the cap 3 has at least one contact element 21 formed by a third substantially flat portion of the inner surface 18 of the cap 3.

The interposing of the "filler" thermal conductor 22 maximises the transfer of heat between both the "SMD" components mounted on the components side 8a of the printed circuit 28 and the cap 3 and between the "PTH" components and the cap 3, since all the empty spaces which are formed, during packaging, between the above-mentioned electronic components 10 and the concave seats 19 and 20 and the flat contact element 21, are "filled".

The inner surface 18 of the cap 3 also has a step 58 which acts as a spacer element of the cap 3 relative to the printed circuit 28.

More specifically, the step 58 prevents the portion of the printed circuit 28 at the MOSFET driver 65 and at the microcontroller 66 from coming into contact with the cap 3 preventing short circuits and abnormal mechanical stresses, the heat exchange being guaranteed by the presence of the thermal conductor 22.

The outer surface 23 of the cap 3 has a plurality of fins 24 for dissipating the heat generated by the electronic module 8.

The fins 24 have a spoke-like extension and a predetermined thickness in order to best perform their dissipating function.

The fins 24 have a height sized so as to obtain the maximum possible efficiency, given the specified design dimensions, of the heat exchange towards the environment.

The outer surface 23 of the cap 3 also has a first convex portion 25 "shaped to match" on the base of the concave portion 19 of the inner surface 18 of the cap 3 and a second portion 26, also convex, "shaped to match" on the base of the concave portion 20.

The fins 24 are mainly positioned on the first and the second shaped to match portions 25 and 26 and on the contact element 21, so as to remove the maximum possible quantity of heat produced by the electronic components 10.

Figure 4:
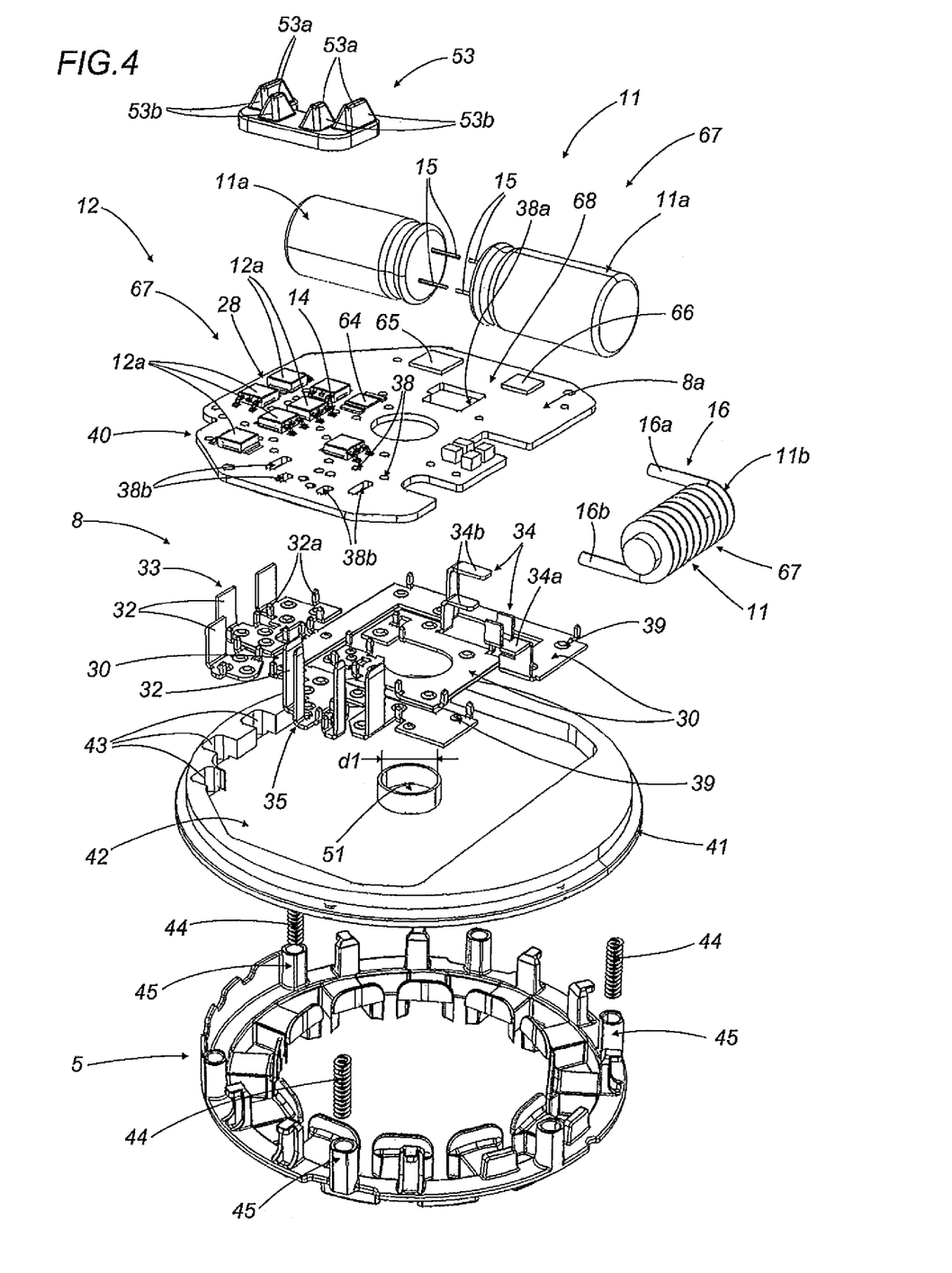
FIG. 4 shows a schematic perspective and exploded view of the electronic control module of the machine of FIG. 3.
Figure 6:
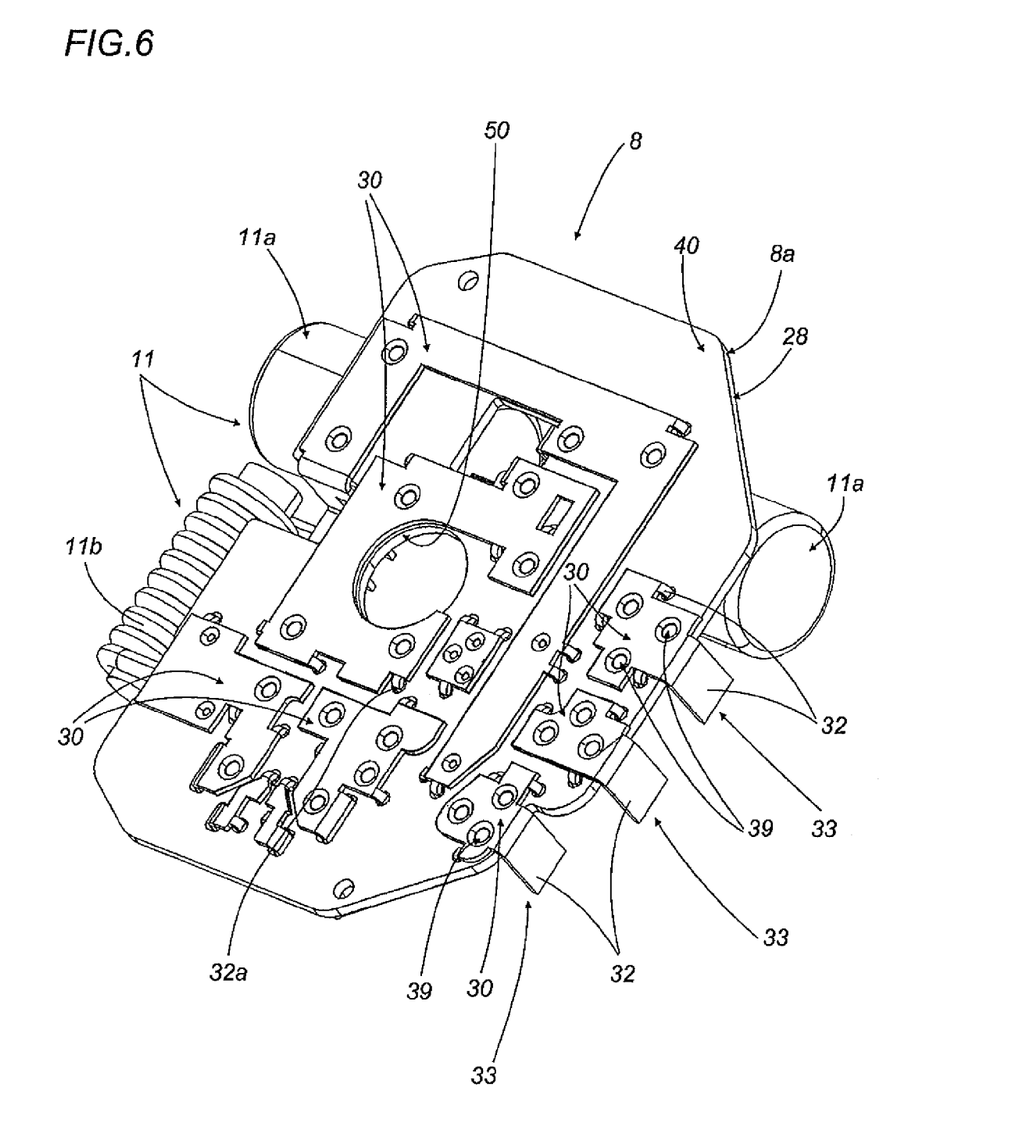
FIG. 6 shows a third schematic perspective view of the electronic control module of FIGS. 4 and 5.

Looking in more detail at the electronic module 8, with reference to FIGS. 4 to 6, it should be noted that the electronic module 8 of the electrical machine 1 comprises a printed circuit 28.

The printed circuit 28 is substantially known as "PCB", that is, "Printed Circuit Board". As illustrated, all the electronic power 67 and signal 68 components are positioned on the components side 8a of the printed circuit 28 which forms the above-mentioned first side of the electronic module.

The electronic module 8 also comprises a plurality of conductor tracks 30 which implement the direct connections between all the electronic power components 67.

More precisely, the conductor tracks 30 form a plurality of electrical connections between the "SMD" electronic power components 12a, 64 and the "PTH" electronic components 11.

The conductor tracks 30 are positioned on a second side or welding side 40 opposite the components side 8a of the printed circuit 28. In other words, the set of PCBs 28, the electronic components 10, both SMD 12 and conventional PTH 11, and the conductor tracks 30, form the electronic module 8 which makes a control circuit of the motor 1 allowing the conveniently controlled supply.

As illustrated, the conductor tracks 30 comprise a plurality of connection tabs 32 and connection terminals 32a. The connection terminals 32a are welded to the printed circuit 28.

More specifically, the conductor tracks 30 have a first, a second and a third set of tabs 33, 34 and 35.

The first set of tabs 33 is welded to the terminals 9 of the electrical winding 6.

The second set of tabs 34 comprises a tab 34a welded to the terminal 16a of the inductor 11b and the tabs 34b welded to the terminals 15 of the capacitors 11a.

More specifically, with reference to the inductor 11b, it should be noted that the inductor has a first terminal 16a welded to a tab 34a and a second terminal 16b welded to one of the conductor tracks 30 without providing a corresponding tab.

The electrical machine 1 comprises cabling 37 for connecting to a power supply network not illustrated.

The cabling 37 is welded to the third set of tabs 35 and makes the power supply circuit of the electronic module 8.

As shown in FIGS. 4 and 5, the printed circuit 28 is equipped with a plurality of metal coated through holes 38.

The metal coated through holes 38 are designed in such a way that the corresponding connection terminals 32a and connection tabs 32 insert partly into the holes through the printed circuit 28.

More specifically, the tabs 34b welded to the terminals 15 of the capacitors 11a are inserted in the respective hole 38a of the printed circuit 28. The third set of connection tabs 35 also crosses the printed circuit through respective holes 38b.

Advantageously, the capacitors 11a and the inductor 11b are directly supported by some of the conductor tracks 30 and in particular by the connection tabs 34a and 34b to which the respective terminals 15 and 16 are welded.

The electronic module 8 comprises a plurality of spacer elements 39 between the conductor tracks 30 and the printed circuit 28. The spacer elements 39 allow a circulation of air between the conductor tracks 30 and the printed circuit 28, thereby creating a "parallel" path for dissipation of the heat generated by the conductor tracks 30 which do not touch the printed circuit 28; they also guarantee the absence of direct contact between the conductor tracks 30 and the printed circuit 28 preventing the occurrence of accidental short circuits.

Advantageously, the spacer elements 39 are integrated in the plurality of conductor tracks 30 forming protuberances located on the same side of the connection tabs 32.

Optionally, the spacer elements 39 are welded to corresponding areas on the side 40 of the printed circuit 28.

The electrical machine 1 comprises a support 41, preferably made in a disc shape from plastic material, housing the electronic module 8.

As illustrated in FIG. 3, the support 41 is equipped with a seat 42 designed to accommodate the electronic module 8.

The support has a set of openings 43 provided for the terminals 9 of the electrical winding 6 welded to the first set of tabs 33.

Advantageously, the conductor tracks 30 are free to deform irrespective of the deformations of the plastic of the support 41: in other words, having separated the plastic part from the circuit the mechanical stresses on the welds between the tabs 32 of the conductor tracks 30 and the printed circuit 28 are reduced substantially.

The electrical machine 1 comprises a plurality of elastic elements 44 pushing the electronic module 8 away from the stator 5 towards the cap 3. The elastic elements 44 operate between the stator 5 and the support 41, so as to push the electronic module 8 towards the cap 3 to move the cases 13 into mechanical contact with the cap; this guarantees that the thermally conductive paste 22 completely fills any gap created between the cases and the cap ensuring in this way the optimum dispersion of the heat generated.

More specifically, the stator 5 has a plurality of tubular seats 45 for the elastic elements 44. The tubular seats 45 are made in an insulating portion of the stator 5.

It is worth noting that the design and the distribution of the elastic elements 45 is performed for an optimum distribution of the pushing forces on the electronic module 8 through the support 41.

In the illustrated embodiment, the stator has three tubular seats 45 for corresponding elastic elements 44 positioned along the periphery of the stator 5 and spaced at equal angular intervals.

Alternatively, there are six tubular seats 45 of the elastic elements 44, each provided with the respective elastic element and positioned along the periphery of the stator 5 and again spaced at equal angular intervals.

The tubular seats 45 hold and guide the elastic elements 44 during their pushing action.

The support 41 also has a plurality of guides, not illustrated, on which the elastic elements 44 act. The guides, not illustrated, are positioned on the side of the support 41 opposite the side on which the seat 42 designed to house the electronic module 8 is made, and they are positioned along the periphery of the support 41 in such a way that each guide, not illustrated, corresponds with the respective tubular seat 45 of the stator 5.

Preferably, the elastic elements 44 are metal springs.

Figure 8:
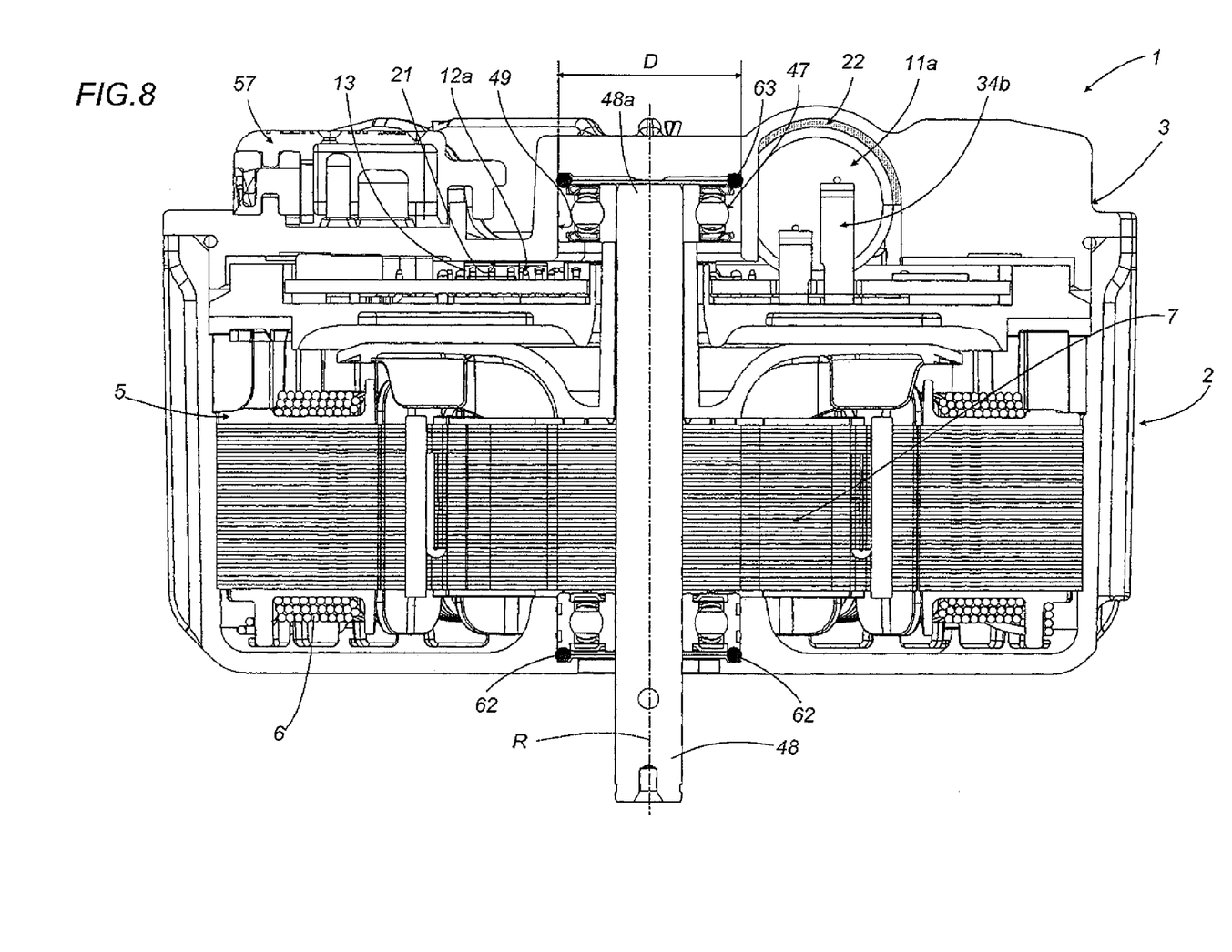
FIG. 8 is a schematic cross-section of the machine of FIG. 2 with some parts cut away for greater clarity.

As illustrated in FIG. 8, the electrical machine 1 comprises a bearing 47 operating between a shaft 48 for transmitting motion rigidly connected to the rotor 7 and the case 4 for rotatably fixing the rotor 7 to the case 4.

The bearing 47 is rigidly connected to the shaft 48 and in particular it is positioned at one of its two ends 48a.

The inner surface 18 of the cap 3 has a fourth portion 49 forming a housing seat of the bearing 47. The housing seat 49 is equipped with a gasket 63 for compensating any clearance between the bearing 47 and the cap 3.

That way, the bearing 47 faces the side 8a of the electronic module 8 on which the "SMD" electronic components 12 and the "PTH" electronic components 11 are present.

The printed circuit 28 has a hole 50 coaxial with the axis of rotation R having a diameter "d" less than the external diameter "D" of the bearing 47. The support 41 has a guide 51 coaxial with the axis of rotation R having an external diameter "d1" less than the diameter "d" of the hole 50.

The diameter "d1" of the guide 51 is substantially less than the diameter "d" of the hole 50 so as to allow the correct positioning and centering of the electronic module 8 on the support 41.

As described in more detail below, the hole 50 and the guide 51 are designed in such a way as to allow the packaging of the electronic module 8 on the casing 2 complete with stator 5 and winding 6 solely if the shaft 48 of the rotor 7 does not have the bearing 47.

Advantageously, the more the size of the hole 50 of the electronic module 8 decreases the more the area of the printed circuit 28 for housing the electronic components 10 increases. In this specific case, the reduction of the diameter of the hole 50 is particularly advantageous since both the "SMD" electronic components 12 and the "PTH" electronic components 11 are located only on the side 8a of the printed circuit 28.

As indicated, the power supply for the electrical machine 1 is provided using the power supply cabling 37, welded to the third set of tabs 35.

With particular reference to FIGS. 3 and 7, it should be noted that the cap 3 has a plurality of openings 52. The third set of tabs 35, forming part of the plurality of conductor tracks 30, is inserted in the respective openings 52 such that the free ends extend outside the cap 3.

At the openings 52 there is a gasket 53 interposed between the cap 3 and the third set of tabs 35.

The gasket 53 has slots 53a for the corresponding tabs 35 and it is shaped so as to cover at least partly the tabs 35 by relative sleeves 53b.

It should be noted that the sleeves 53b are partly inserted in the openings 52 so as to guarantee a seal between cap 3 and tabs 35 and prevent entry into the case 4 of extraneous agents.

The electrical machine 1 comprises a first and a second guide 54 and 55 joined together for holding the power supply cabling 37.

The first and the second guide 54 and 55 form an element 56 for holding the cabling 37.

In an alternative embodiment, not illustrated, the holding element 56 is made in a single component.

The holding element 56 couples with the cap 3 for keeping the cabling 37 stationary relative to the third set of tabs 35 and allowing the reciprocal welding.

A cover 57 partly screens the holding element 56 in such a way that the cabling 37 extends outside the electrical machine 1 for connecting to a power supply source.

Advantageously, to guarantee a hermetic seal at the welding between the cabling 37 and the power supply circuit of the machine 1, a resin, not illustrated, covers the welding entirely and remains protected by the cover 57.

The cover 57 has a through hole 59 for injecting resin and a through hole 60 for venting air.

The casing 2 is equipped with a plurality of fins 61 positioned along the cylindrical outer surface of the casing 2. The fins have a predetermined thickness and height to make a heat exchange surface designed to dissipate the heat generated in particular by the winding 6 of the stator 5.

This invention also relates to a method for packaging the machine 1 as described above, the description of which is also limited to that necessary for the understanding of the invention.

The packaging method comprises the steps of preparing the casing 2, inserting the stator 5 in the casing 2 with the related windings 6, inserting the rotor 7 in the casing 2 with the exception of the bearing 47 and preparing the elastic elements 44 in the tubular seats 45 of the stator 5. The casing 2 is equipped with a gasket 62 located at the end of the shaft 48 of the rotor 7 which extends outside the casing 2, in such a way as to prevent the entry of extraneous agents.

The support 41 is positioned in such a way that the terminals 9 of the windings 6 are located at the openings 52 and in such a way that the elastic elements 44 are engaged in the respective seats, not illustrated, of the support 41.

The electronic module 8 is positioned in the seat 42 of the support 41 such that the first set of connection tabs 33 is located at the openings 43.

Advantageously, the electronic module 8 and the support 41 are pre-packaged, that is, the module 8 is connected to the support 41 and they are then inserted together in the casing 2.

The terminals 9 of the electrical winding 6 are welded to the first set of tabs 33 making a safe electrical contact between the parts.

The method then comprises keying the bearing 47 on the end 48a of the shaft 48 of the rotor 7.

The thermal conductor 22 is positioned on the inner surface 18 and in the seats 19 and 20 of the cap 3.

Figure 9:
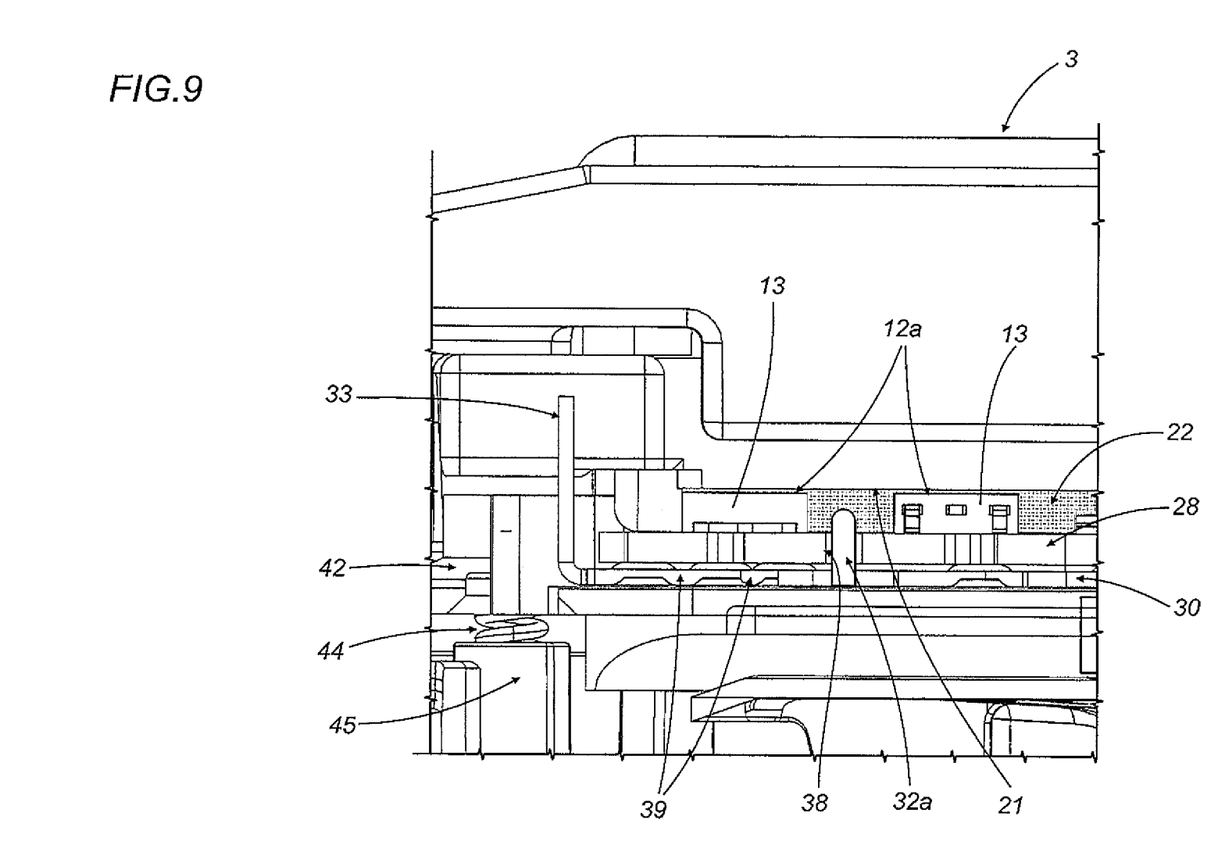
FIG. 9 is a scaled-up schematic cross-section of a detail of the machine of FIG. 2 with some parts cut away in order to better illustrate others.

The thermal conductor 22 is also positioned directly on the electronic components 10. That way, the thermal conductor 22, as well as being interposed between the case 13 of the MOSFETs 12a and the cap 3, also touches the terminals of both the electronic power components 67 and the electronic signal components 68 which are therefore also moved into thermal contact with the cap 3 through the thermal conductor 22 improving the heat dispersion, as illustrated in FIG. 9.

The cap 3 is then positioned over the electronic module 8 in such a way that the seats 19, 20 and the contact element 21 are positioned at the respective "PTH" electronic components 11 and the "SMD" electronic components 12.

The gasket 53 is positioned on the tabs 35 and an annular gasket 27 is interposed between the cap 3 and the casing 2.

After the cap 3 has been positioned, and fixed to the casing 2 in a substantially known manner not described, the holding element 56 of the cabling 37 is connected to the cap 3 and the third set of tabs 35 is welded with the cabling 37.

The set of welds is sealed using the resin injected in the through hole 59 of the cover 57.

With the motor packaged, the elastic elements 44 act on the support 41 pushing the electronic module 8 towards the cap 3. That way, the electronic power components 67 are all moved into direct contact with the cap 3 which will act as contact element and heat dissipator.

Advantageously, since the elastic elements 44 act on the support 41 the latter prevents the pushing action of the elastic elements 44 from deforming the electronic module 8.

The above-mentioned step 58 contributes to maintaining a substantial planarity of the printed circuit 28, preventing the driver 65 and the microcontroller 66 from coming into contact with the cap 3.

Looking more in detail at the packaging of the electronic module 8 a method of packaging the module is described.

The method of packaging the electronic module 8 comprises a step of preparing, with known methods, the printed circuit 28.

The method comprises placing on the first side 8a of the printed circuit 28 the "SMD" electronic power components 12a, 64 and the electronic signal components 68, after interposing a thin layer of welding paste.

Advantageously, the step of welding the "SMD" electronic components occurs in a controlled temperature oven according to the packaging technique known as "SMT", that is, "Surface Mounting Technology".

The welding occurs maintaining the printed circuit 28 in a substantially horizontal position with the components 12 resting on the printed circuit.

The packaging method comprises at this point rotating the printed circuit 28 by 180° with all the "SMD" electronic components 12a, 64 already welded in such a way that the components face downwards and the side 40 is accessible from above for facilitating the positioning of the conductor tracks 30.

This is followed by the positioning of the conductor tracks 30 on the side 40 of the printed circuit 28 in such a way as to insert the connection tabs 34b, the third set of tabs 35 and the connection terminals 32a in the respective holes 38a, 38b and 38.

The conductor tracks 30 are then welded to the printed circuit 28. Advantageously, the welding of the conductor tracks 30 occurs in a controlled temperature oven to prevent the deterioration of the welds made previously and in particular the detachment of the "SMD" electronic components 12a, 64 previously welded on the side 8a of the printed circuit. After welding the conductor tracks 30 with the printed circuit 28 the assembly formed is again rotated by 180° to make the tabs 34*a* and 34*b* accessible from above for facilitating the positioning of the "PTH" electronic components 11.

The "PTH" electronic components 11 are now welded to the conductor tracks 30: in particular, the terminals 15 of the capacitors 11*a* are welded to the respective connection tabs 34*b*, the terminal 16*a* of the inductor 11*b* to the respective connection tab 34*a*, and the terminal 16*b* of the inductor 11*b* to the relative conductor track.

In a second embodiment, the process of packaging the electronic module 8 consists in placing in a known manner the welding paste on the side 8*a* of the printed circuit 28 and positioning on that side all the "SMD" electronic components 12*a*, 64.

The method comprises at this point rotating the printed circuit 28 by 180° with all the "SMD" electronic components positioned on the side 8*a*, but not welded, in such a way that they face downwards and the side 40 is accessible from above. The interposing of the welding paste between the "SMD" electronic components 12*a*, 64 and the printed circuit 28 prevents detachment of the components even if facing downwards following the above-mentioned rotation.

The conductor tracks 30 are then positioned on the side 40 of the printed circuit 28 in such a way as to insert the connection tabs 34*b*, the third set of tabs 35 and the connection terminals 32*a* in the respective holes 38*a*, 38*b* and 38.

The "SMD" electronic components 12*a*, 64 and the conductor tracks 30 are now welded in a single run to the printed circuit 28; advantageously, the welding occurs in a controlled temperature oven.

Similarly to the previous packaging method, after performing the above-mentioned single welding run, the assembly formed is again rotated by 180° to make the tabs 32 of the conductor tracks 30 accessible from above, facilitate the positioning of the "PTH" electronic components 11 and perform the relative welding.

It is evident from the previous description how the various drawbacks, highlighted in the introduction with reference to the prior art, are eliminated according to this invention.

The positioning of the electronic power components 67 on the side 8*a* of the printed circuit 28, which allows the case of the components—after interposing the thermal conductor—to be placed in contact with the cap 3, allows the heat generated by them to be effectively dissipated through the case: this is possible as the thickness of the cases of the components currently on the market is considerably less than that of the cases of the previous generations.

Relative to the prior art, the electronic module 8 has the printed circuit 28 welded to the plurality of conductor tracks 30: this simplifies both the production process and the packaging of the electronic module 8 providing a great economic advantage.

The conductor tracks 30, being made preferably from copper, have a linear thermal expansion coefficient similar to the linear thermal expansion coefficient of the printed circuit 28, and thereby guarantee a higher degree of reliability of the welds between conductor tracks and printed circuit.

The invention claimed is:

1. A rotating electrical machine comprising:
   an electronic module comprising
   a printed circuit,
   a plurality of "SMD" electronic power components and
   a plurality of "SMD" electronic signal components,
   a plurality of "PTH" electronic components,
   the "SMD" electronic power components,
   the "SMD" electronic signal components and
   the "PTH" electronic components being positioned on a first side of the printed circuit, the electronic module further comprising a plurality of conductor tracks, having a plurality of tabs supporting the "PTH" electronic components, positioned on a second side of the printed circuit opposite the first side, the plurality of conductor tracks forming a plurality of electrical connections between the "SMD" electronic power components and the "PTH" electronic components.

2. The machine according to claim 1, wherein the conductor tracks comprise elements for spacing the conductor tracks from the printed circuit.

3. The machine according to claim 1, and further comprising: a dissipator for dispersing the heat generated by the electronic module, a thermal conductor interposed between the "SMD" electronic power components, the "SMD" electronic signal components, the "PTH" electronic components and the dissipator, the "SMD" electronic power components, the "SMD" electronic signal components and the "PTH" electronic components being in contact with the dissipator through the thermal conductor, a support housing the electronic module positioned opposite the dissipator and a plurality of elastic elements acting on the support, the elastic elements pushing the "SMD" electronic power and signal components and the "PTH" electronic components against the dissipator through the support.

4. The machine according to claim 1, and further comprising a casing, a rotor inserted in the casing, a cap for closing the casing forming with the casing a closed case and a bearing for connecting the rotor with the closed case, the printed circuit having a hole coaxial with the axis of rotation having diameter less than the external diameter of the bearing.

5. A method of packaging a rotating electrical machine comprising:
   providing:
      an electronic module comprising
      a printed circuit,
      a plurality of "SMD" electronic power components and
      a plurality of "SMD" electronic signal components
      a plurality of "PTH" electronic components,
      the "SMD" electronic power components,
      the "SMD" electronic signal components and
      the "PTH" electronic components being positioned on a first side of the printed circuit, the electronic module further comprising a plurality of conductor tracks, having a plurality of tabs supporting the "PTH" electronic components, positioned on a second side of the printed circuit opposite the first side, the plurality of conductor tracks forming a plurality of electrical connections between the "SMD" electronic power components and the "PTH" electronic components;
   packaging the electronic module comprising a step of positioning the "SMD" electronic power components and the "SMD" electronic signal components on the first side of the printed circuit, a first step of welding the "SMD" electronic power components and the "SMD" electronic signal components on the first side of the printed circuit, a step of positioning the plurality of conductor tracks on the second side of the printed circuit opposite the first side; a second step of welding the plurality of conductor tracks with the printed circuit, a step of positioning the "PTH" electronic components on the tabs and a third step of welding the "PTH" electronic components to the tabs.

6. The method according to claim 5, wherein the first and the second welding step occur simultaneously.

* * * * *